(12) United States Patent
Taniguchi

(10) Patent No.: US 6,507,515 B2
(45) Date of Patent: Jan. 14, 2003

(54) SEMICONDUCTOR MEMORY

(75) Inventor: Tsutomu Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/046,758

(22) Filed: Jan. 17, 2002

(65) Prior Publication Data

US 2002/0136060 A1 Sep. 26, 2002

(30) Foreign Application Priority Data

Mar. 23, 2001 (JP) ........................................ 2001-085532

(51) Int. Cl.[7] .............................................. G11C 16/00
(52) U.S. Cl. .............................. 365/185.17; 365/185.11; 365/230.03
(58) Field of Search ........................ 365/185.17, 185.11, 365/185.13, 230.03

(56) References Cited

U.S. PATENT DOCUMENTS 5,293,350 A    3/1994  Kim et al. ................ 365/238.5
5,898,616 A  * 4/1999  Ono ....................... 365/185.17
5,909,392 A  * 6/1999  Chang et al. ........... 365/185.17
6,272,046 B1 * 8/2001  Shimada ................. 365/185.17

* cited by examiner

*Primary Examiner*—Tan T. Nguyen
(74) *Attorney, Agent, or Firm*—Arent Fox Kintner Plotkin & Kahn, PLLC (57) ABSTRACT

First transistor rows are arranged, each including two transistors connected in series for selectively connecting any of memory cell rows to an input/output circuit. A switching transistor operates as a switch and a short transistor(s) each having a source and a drain shorted to each other function(s) as wiring. The first transistor rows are provided with a plurality of transistors in advance. Since there is no need to selectively form only such a transistor that is to be operated as a switch, there is no need to form ion-implanted regions for making a source and a drain per transistor. As a result, the spacing with which the transistors are arranged can be set without considering the layout rule of the diffusion layer regions. Since the transistors can be arranged closely, the layout area can be decreased and the chip size of the semiconductor memory can be reduced.

10 Claims, 7 Drawing Sheets

Prior Art

Fig. 1A

Prior Art

Fig. 1B

Prior Art

SEMICONDUCTOR MEMORY

BACKGROUND OF THE INVENTION

1. Field of the Invention

The present invention relates to the layout of a memory cell array in a semiconductor memory, and more particularly to a technology for reducing the chip size of a semiconductor memory.

2. Description of the Related Art

Semiconductor memories have sense amplifiers for amplifying data that is read out from memory cells to bit lines. In addition, nonvolatile semiconductor memories such as a flash memory have voltage generators for supplying a high voltage or a low voltage to source lines according to memory operations. U.S. patent application Ser. No. 5,293,350 has disclosed a technique in which a sense amplifier, a voltage generator, and the like are shared among a plurality of bit lines and the like, to reduce the chip size of the semiconductor memory.

Figure 1A:
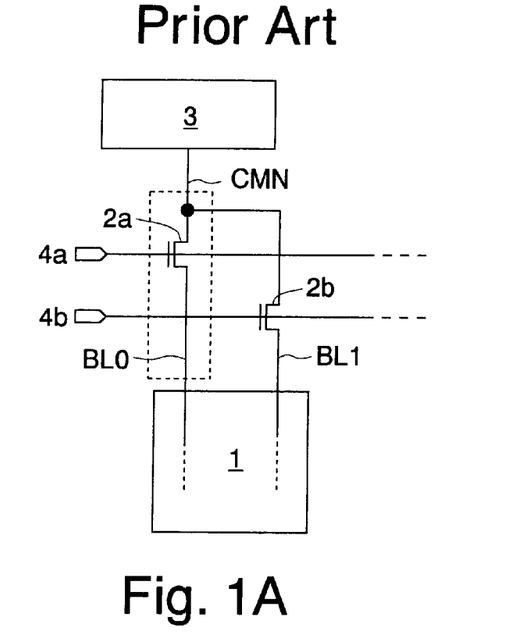
FIG. 1A is a block diagram showing the circuit configuration of the essential parts of a conventional semiconductor memory.
Figure 1B:
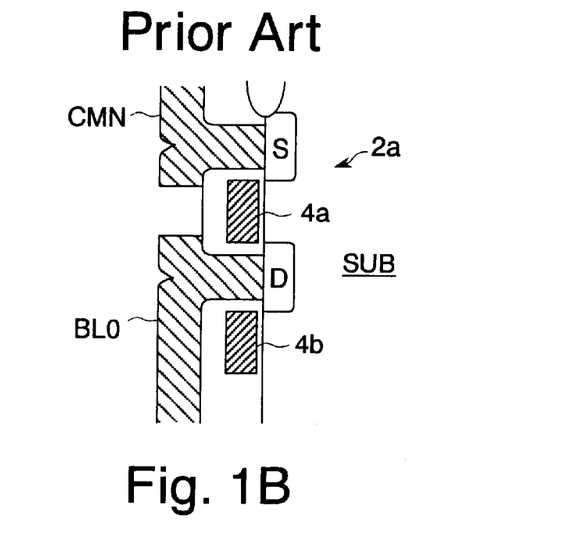
FIG. 1B is a sectional view of FIG. 1A.

FIGS. 1A and 1B show the essential parts of a semiconductor memory of this type. FIG. 1A shows the circuit configuration and FIG. 1B shows a sectional structure of the area that is shown by the broken lines in FIG. 1A.

A memory cell array 1 is provided with bit lines BL0 and BL1, which are connected to its memory cells (not shown). The bit lines BL0 and BL1 are connected to a sense amplifier 3 (or a voltage generator etc.) through transistors 2a and 2b respectively and a common signal line CMN. The gates of the transistors 2a and 2b are connected to control lines 4a and 4b respectively. The control lines 4a and 4b are laid perpendicular to the bit lines BL0 and BL1.

In this semiconductor memory, when the memory cell array is in a read operation, one of the control lines 4a and 4b is changed to a high level, turning ON either of the transistors 2a and 2b. It follows that one of the bit lines BL0 and BL1 is connected to the sense amplifier 3 through the common signal line CMN, whereby the data read out from a memory cell to the bit line BL0 (or BL1) is amplified. That is, the sense amplifier 3 is shared between the bit lines BL0 and BL1.

As shown in FIG. 1B, the transistor 2a is composed of diffusion layers (a source S and a drain D) which are formed in a semiconductor substrate SUB, and a control line 4a which is laid on the semiconductor substrate SUB via a gate insulator. The source S of the transistor 2a is connected to the common signal line CMN. The drain D of the transistor is connected to the bit line BL0. Since the broken-lined area of FIG. 1A allows no transistor that has the control line 4b as its gate, the source and the drain (diffusion layers) corresponding to the control line 4b are not formed in the semiconductor substrate SUB.

Figure 2:
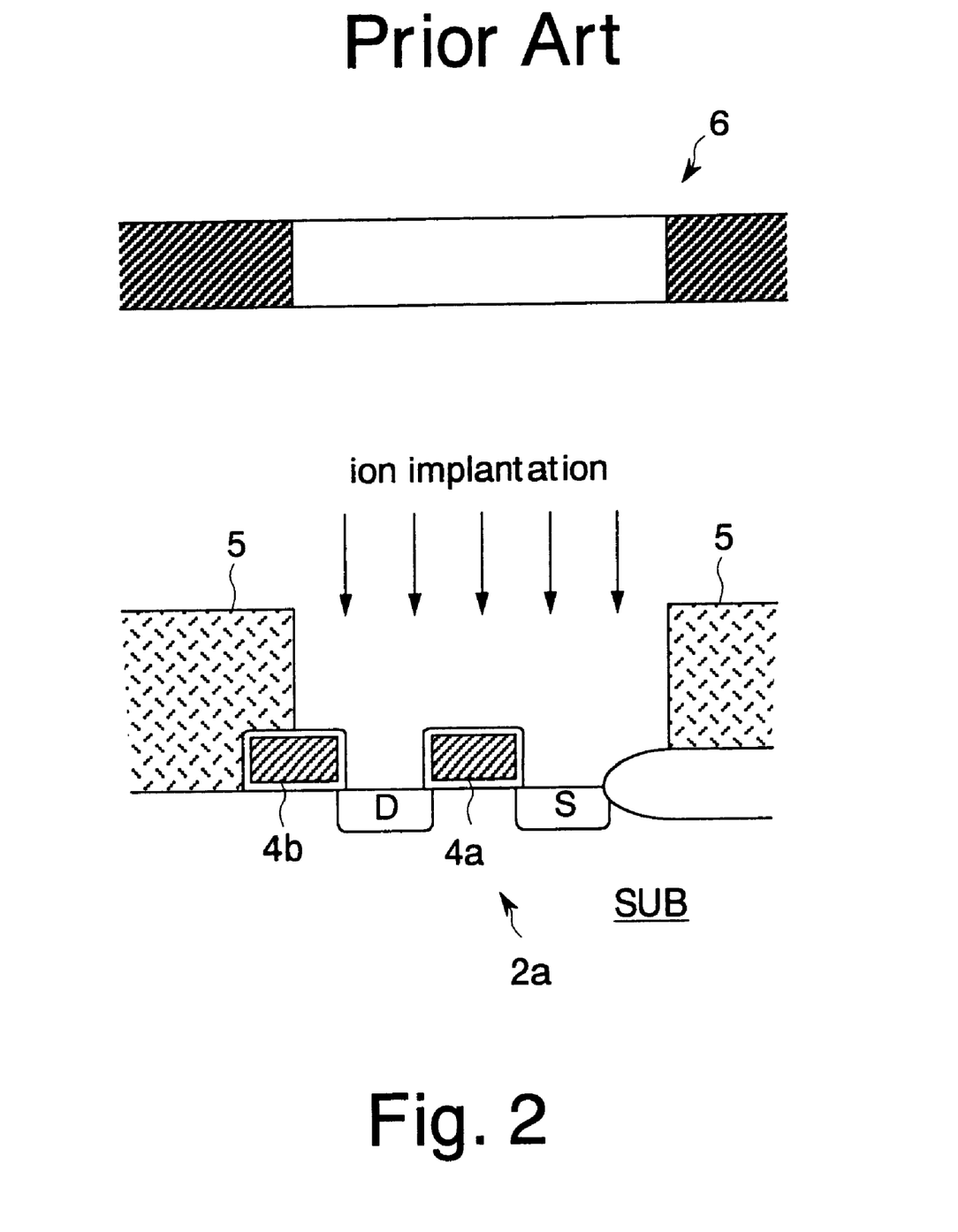
FIG. 2 is an explanatory diagram showing a method of fabricating the conventional semiconductor memory.

FIG. 2 shows an overview of the fabrication process for forming the source S and the drain D of the transistor 2a.

The source S and the drain D are formed by implanting ions into the semiconductor substrate SUB with the gate of the transistor 2a (the control line 4a) as a mask. To form the transistor 2a, a photoresist 5 is initially applied to over the semiconductor substrate SUB (wafer) and then baked. Next, exposure is performed using a photomask 6, followed by development, so that the photoresist 5 is processed into a shape corresponding to the photomask 6 as shown in FIG. 2. Subsequently, as shown by the arrows in the diagram, phosphorus or other ions are implanted selectively to form the source S and the drain D of the transistor 2a. Here, no ion is implanted into the regions covered under the photoresist 5 (outside of the source S and the drain D of the transistor 2a). Thus, no transistor having the control line 4b as its gate is formed in the broken-lined area of FIG. 1A.

As shown in FIG. 1A, the control lines 4a and 4b to be the gates of the transistors 2a and 2b are laid perpendicular to the bit lines BL0 and BL1. The transistors 2a and 2b are formed by implanting ions with these control lines 4a and 4b as masks. This requires that regions undesired of transistor formation (for example, the regions adjacent to the control line 4b within the broken-lined area of FIG. 1A) must be masked with the photoresist 6. In other words, to selectively connect the bit lines BL0 and BL1 to the sense amplifier 3 and the like, the photoresist 6 needs to be opened for each of the transistors 2a and 2b corresponding to the bit lines BL0 and BL1, respectively.

The openings in the photoresist 6 must be made with predetermined margins from the regions to form transistors and those not to form transistors. Owing to these margins, there has been a problem of an increased layout area when the wiring spacing between the control lines 4a and 4b needs to be extended beyond the formable minimum process size. Since the increased layout area grows the chip size of the semiconductor memory, there has been a problem of a rise in product costs. The memory cell array and its peripheral regions (sense-amplifier regions etc.) contain a number of identical circuits arranged repeatedly. On this account, an increase in the layout area of these regions has a significant impact on the product costs of the semiconductor memory.

SUMMARY OF THE INVENTION

It is an object of the present invention to improve the integration level of a memory cell array and its periphery to reduce the chip size of a semiconductor memory.

According to one of the aspects of the present invention, a semiconductor memory has a plurality of memory cell rows, an input/output circuit for inputting/outputting data to/from the memory cell rows, and a plurality of first transistor rows arranged for each of the memory cell rows. The memory cell rows include a plurality of memory cells connected in series. For example, the memory cells are nonvolatile memory cells each having a control gate and a floating gate, and the memory cell rows are configured as a NAND type.

The first transistor rows have a plurality of transistors connected in series. For example, the memory cell rows are connected to the first transistor rows through local bit lines, respectively. The first transistor rows are connected to the input/output circuit through a global bit line, which is common to these transistor rows.

In each first transistor rows, a switching transistor operates as a switch while a short transistor(s) each having a source and a drain shorted to each other function(s) as wiring. When performing a read/write operation from/to the memory cells, any of the switches (transistors) among the plurality of first transistor rows turns on to selectively connect any of the memory cell rows to the input/output circuit. That is, the input/output circuit is shared among the plurality of memory cell rows.

The first transistor rows are provided with the plurality of transistors in advance regardless of whether or not to use the transistors as switches. Since there is no need to selectively form only such a transistor that is to be operated as a switch, there is no need to form ion-implanted regions for making a source and a drain per transistor. As a result, the pattern shape of the photomask corresponding to the ion-implanted regions (the layout rule of the diffusion layer regions) need not be taken account of when arranging the spacing between the transistors of the first transistor rows (the wiring spacing of the gate material). Since the transistors can be arranged closely, the layout area of the first transistor rows can be reduced. This allows a reduction in the chip size of the semiconductor memory. The present invention offers a high effect when applied to nonvolatile semiconductor memories of NAND type which feature high integration.

According to another aspect of the present invention, the semiconductor memory is provided with a plurality of the memory cell rows corresponding to each of the first transistor rows. These memory cell rows are respectively connected to a corresponding transistor row of the first transistor rows through selecting transistors in each of the memory cell rows. Since any of the memory cell rows are selectively connected to the corresponding transistor row of the first transistor rows by the selecting transistors, the first transistor rows can be shared among a plurality of memory cell rows. As a result, the input/output circuit can be shared among a greater number of memory cell rows and the chip size can be reduced.

According to another aspect of the present invention, in each of the first transistor rows, the source and the drain of the short transistor not to be operated as a switch are shorted to each other by using metal wiring. The metal wiring is formed in a latter stage of the semiconductor fabrication processes after the formation of the transistors of the transistor rows. Therefore, for example, when prototyping the semiconductor memory, even if a mistake is found in a position of the transistor to be operated as a switch in each of the first transistor rows, this mistake can be corrected by simply changing the photomask in the wiring process. Conventionally, when such mistake is found, a makeover from the process of forming the diffusion layers (the source and the drain of the transistor) was needed.

According to another aspect of the present invention, the semiconductor memory has a voltage generator for supplying a predetermined voltage to the unselected memory cell row(s) among the memory cell rows, and a plurality of second transistor rows arranged for each of the memory cell rows. The second transistor rows include a plurality of transistors connected in series. For example, the memory cell rows are connected to the first and second transistor rows through local bit lines, and the second transistor rows are connected to the voltage generator through a bit control line, which is common to these transistor rows.

In each of the second transistor rows, a switching transistor operates as a switch while a short transistor(s) each having a source and a drain shorted to each other function(s) as wiring. When performing a read/write operation from/to the memory cells, any of the switches (transistors) among the plurality of second transistor rows turn(s) on to selectively connect any of the memory cell rows to the voltage generator. That is, the voltage generator is shared among the plurality of memory cell rows. The voltage generator supplies, for example, a first voltage and a second voltage to the local bit line(s) of the unselected memory cell row(s), respectively, when the selected memory cell row among the memory cell rows performs a read operation and a write operation.

The second transistor rows are provided with the plurality of transistors in advance. Since there is no need to selectively form only such a transistor that is to be operated as a switch, there is no need to form ion-implanted regions for making a source and a drain per transistor. As a result, the pattern shape of the photomask corresponding to the ion-implanted regions (the layout rule of the diffusion layer regions) need not be taken account of when arranging the spacing between the transistors of the second transistor rows (the wiring spacing of the gate material). Since the transistors can be arranged closely, the layout area of the second transistor rows can be reduced. This allows a reduction in the chip size of the semiconductor memory.

According to another aspect of the present invention, the input/output circuit and the voltage generator are arranged on both sides of the memory cell rows. On this account, the input/output circuit and the voltage generator can be efficiently arranged in the peripheral regions of the memory cell rows without increasing the layout area.

According to another aspect of the present invention, in each of the second transistor rows, the source and the drain of the short transistor not to be operated as a switch are shorted to each other by using metal wiring. The metal wiring is formed in a latter stage of the semiconductor fabrication processes after the formation of the transistors of the transistor rows. Therefore, for example, when prototyping the semiconductor memory, even if a mistake is found in position of the transistor to be operated as a switch in each of the second transistor rows, this mistake can be corrected by simply changing the photomask in the wiring process.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, an embodiment of the present invention will be described with reference to the drawings.

Figure 3:
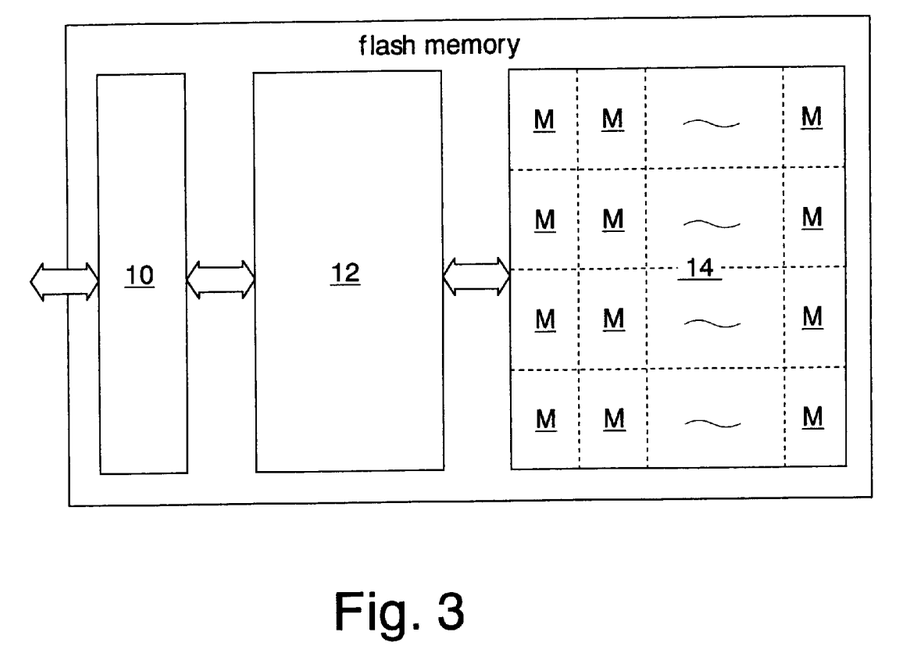
FIG. 3 is a block diagram showing a first embodiment of the semiconductor memory in the present invention.

FIG. 3 shows an embodiment of the semiconductor memory in the present invention. This semiconductor memory is formed as a flash memory (nonvolatile semiconductor memory) of NAND type on a silicon substrate by using CMOS processes.

The flash memory has an input/output unit 10 for inputting/outputting commands, addresses, data, and the like, a control unit 12 for controlling read operations, write operations (program operations), and erase operations, and a memory array unit 14 including memory cell arrays and peripheral circuits thereof. The memory array unit 14 is divided into a plurality of memory cores M.

Figure 4:
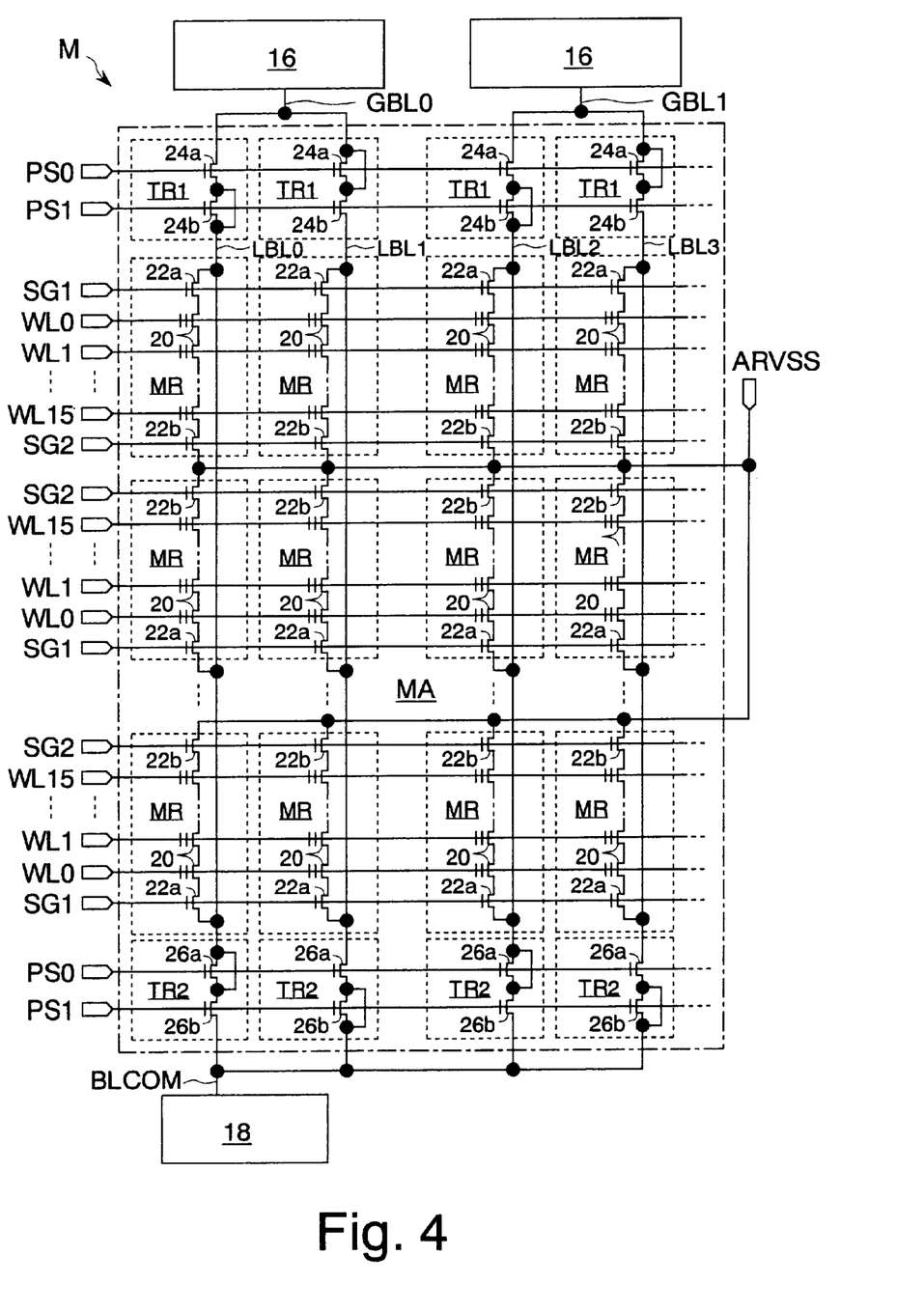
FIG. 4 is a circuit diagram showing a memory core of FIG. 3.

FIG. 4 shows part of the memory cores M.

A memory core M has a memory cell array MA, along with input/output circuits 16, a voltage generator 18, an address decoder, etc. (not shown) which are arranged around this memory cell array MA. The input/output circuits 16 include sense amplifiers, write amplifiers, and so on. The input/output circuits 16 and the voltage generator 18 are arranged on both sides of the memory cell array MA. This allows the input/output circuits and the voltage generator to be efficiently arranged in the peripheral regions of the memory cell array MA without increasing the layout area of the memory core M.

The memory cell array MA has a plurality of memory cell rows MR, a plurality of first transistor rows TR1, and a plurality of second transistor rows TR2. The plurality of memory cell rows MR is arranged in series along local bit lines LBL0, LBL1, LBL2, LBL3, . . . which are laid vertically in the diagram. The first transistor rows TR1 are arranged on an end of the memory cell array MA closer to the input/output circuits 16. The second transistor rows TR2 are arranged on an end of the memory cell array MA closer to the voltage generator 18.

Each memory cell row MR has sixteen memory cells 20 connected in series and two selecting transistors 22a, 22b. Each of the memory cells 20 has a control gate and a floating gate. The gates of the memory cells 20 each are connected to one of word lines WL0–WL15. The gates of the selecting transistors 22a and 22b are connected to selecting lines SG1 and SG2, respectively. The source and the drain of the selecting transistor 22a are connected to the memory cell 20 that is controlled by the word line WL0 and to the local bit line LBL0 (or LBL1, LBL2, LBL3), respectively. The source and the drain of the selecting transistor 22b are connected to the memory cell 20 that is controlled by the word line WL15 and to a source line ARVSS, respectively. The source line ARVSS is a common power supply line connected to all the selecting transistors 22b in the memory cell array MR. The source line ARVSS becomes 0 V in read operations, becomes 4 V in write operations, and becomes floating in erase operations.

Each of the first transistor rows TR1 has two transistors 24a and 24b (a switching transistor or a short transistor) connected in series. Each first transistor row TR1 is connected to the local bit line LBL0 (or LBL1, LBL2, LBL3) and a global bit line GBL0 (or GBL1) at one end and at the other end, respectively. The gates of the transistors 24a and 24b are connected to selecting lines PS0 and PS1, respectively. The voltages of the selecting lines PS0 and PS1 are set in accordance with an address signal supplied from the exterior of the memory. In the first transistor rows TR1 that are connected with the even-numbered local bit lines LBL0 and LBL2, the transistors 24b (short transistors) have their source and drain shorted with aluminum wiring or the like so as to be masked of transistor functions. That is, these transistors function as wiring. Similarly, in the first transistor rows TR1 that are connected with the odd-numbered local bit lines LBL1 and LBL3, the transistors 24a (short transistors) have their source and drain shorted with aluminum wiring or the like so as to function as wiring.

The second transistor rows TR2 each have two transistors 26a and 26b (a switching transistor or a short transistor) connected in series. Each second transistor row TR2 is connected at one end and at the other end to the local bit line LBL0 (or LBL1, LBL2, LBL3) and a bit control line BLCOM, respectively. The gates of the transistors 26a and 26b are connected to the selecting lines PS0 and PS1, respectively. In the second transistor rows TR2 that are connected with the even-numbered local bit lines LBL0 and LBL2, the transistors 26a (short transistors) have their source and drain shorted with aluminum wiring or the like so as to be masked of transistor functions. That is, these transistors function as wiring. Similarly, in the second transistor rows TR2 that are connected with the odd-numbered local bit lines LBL1 and LBL3, the transistors 26b (short transistors) have their source and drain shorted with aluminum wiring or the like so as to function as wiring.

As described above, this embodiment is characterized in that a plurality of transistors connected in series (first transistor row TR1) are arranged between the local bit line LBL0 (or LBL1, LBL2, LBL3) and the global bit line GBL0 (or GBL1). Another characteristic lies in that a plurality of transistors connected in series (second transistor row TR2) are arranged between the local bit line LBL0 (or LBL1, LBL2, LBL3) and the bit control line BLCOM.

The input/output circuits 16 are formed corresponding to the global bit lines GBL0 and GBL1, respectively. The input/output circuits 16 input/output data to be read/written from/to the memory cell rows MR through the global bit line GBL0 (or GBL1).

The voltage generator 18 is formed, for example, one for each memory core M. The voltage generator 18 supplies a predetermined voltage to the local bit lines LBL of memory cell rows MR that are not in operation. More specifically, the voltage generator 18 outputs 0 V in read operations, outputs 4 V in write operations, and suspends output in erase operations (floating).

Figure 5:
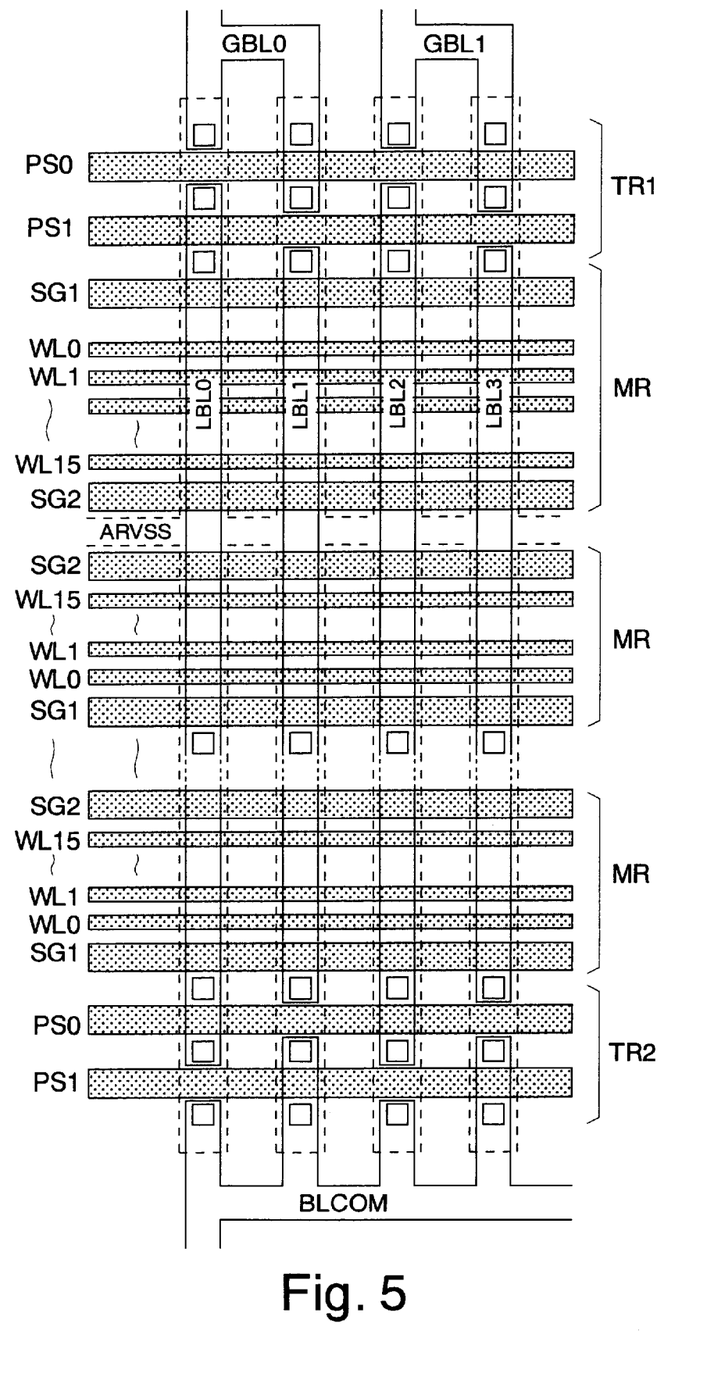
FIG. 5 is a layout diagram showing a memory core of FIG. 3.

FIG. 5 shows the layout of the memory core M shown in FIG. 4.

The selecting lines PS0, PS1, selecting lines SG1, SG2, and word lines WL0–WL15 shown shaded (extending horizontally in the diagram) are made of gate material such as polysilicon. The global bit lines GBL0, GBL1, local bit lines LBL0, LBL1, LBL2, LBL3, and bit control line BLCOM shown in full lines (extending vertically in the diagram) are made of metal such as aluminum. The broken-lined area indicates diffusion layers (the sources and the drains of the transistors, and wiring). More specifically, in the forming process of the diffusion layers, an opening is made in the photoresist within the broken-lined area (on the side including contact holes, which are shown by the squares). Phosphorous or other ions are implanted to inside this area with gate wiring as a mask. Therefore, the diffusion layers are formed within the area exclusive of where the polysilicons lie, which are shown shaded.

In this embodiment, all the first and second transistor rows TR1 and TR2 are provided with the transistors that have the selecting lines PS0 and PS1 as their gates. That is, the transistor rows TR1 and TR2 are provided with two transistors each. As described in FIG. 4, in the first transistor rows TR1 connected with the even-numbered local bit lines LBL0 and LRL2, the sources and the drains of the transistors that have the selecting line PS1 as their gates are connected to each other by aluminum wiring or the like through the contact holes. In the second transistor rows TR2 connected with the even-numbered local bit lines LBL0 and LBL2, the sources and the drains of the transistors that have the selecting line PS0 as their gates are connected to each other by aluminum wiring or the like through the contact holes. In the first transistor rows TR1 connected with the odd-numbered local bit lines LBL1 and LBL3, the sources and the drains of the transistors that have the selecting line PS0 as their gates are connected to each other by aluminum wiring or the like through the contact holes. In the second transistor rows TR2 connected with the odd-numbered local bit lines LBL1 and LBL3, the sources and the drains of the transistors that have the selecting line PS1 as their gates are connected to each other by aluminum wiring or the like through the contact holes.

As described above, in this embodiment, all the formable transistors in the transistor rows TR1 and TR2 are formed in advance, and in the wiring process using aluminum or the like, the sources and the drains of those transistors not to operate are shorted to each other. As shown by the broken lines in the diagram, the opening of the photoresist (forming area of the diffusion layers) is not made in units of transistors but formed in to an area extending along the local bit lines LBL0–LBL3. This makes it possible to minimize the wiring spacing between the selecting lines PS0 and PS1 independent of the layout rule of the photoresist openings. Consequently, the memory cores M become smaller in layout size as compared to heretofore.

The connections between the sources and the drains of the transistor rows TR1, TR2 are established by aluminum wiring. Therefore, even if mistakes are found in the prototyping or other phases of the flash memory as to the positions of transistors to be masked of functions in the transistor rows, the mistakes can be dealt with merely by making over the photomask for the wiring process using aluminum or the like. That is, prototyping defects can be fed back promptly and easily. Conventionally, mistakes of transistor positions necessitated a makeover from the diffusion process, taking much time for the defects to be fed back.

Figure 6:
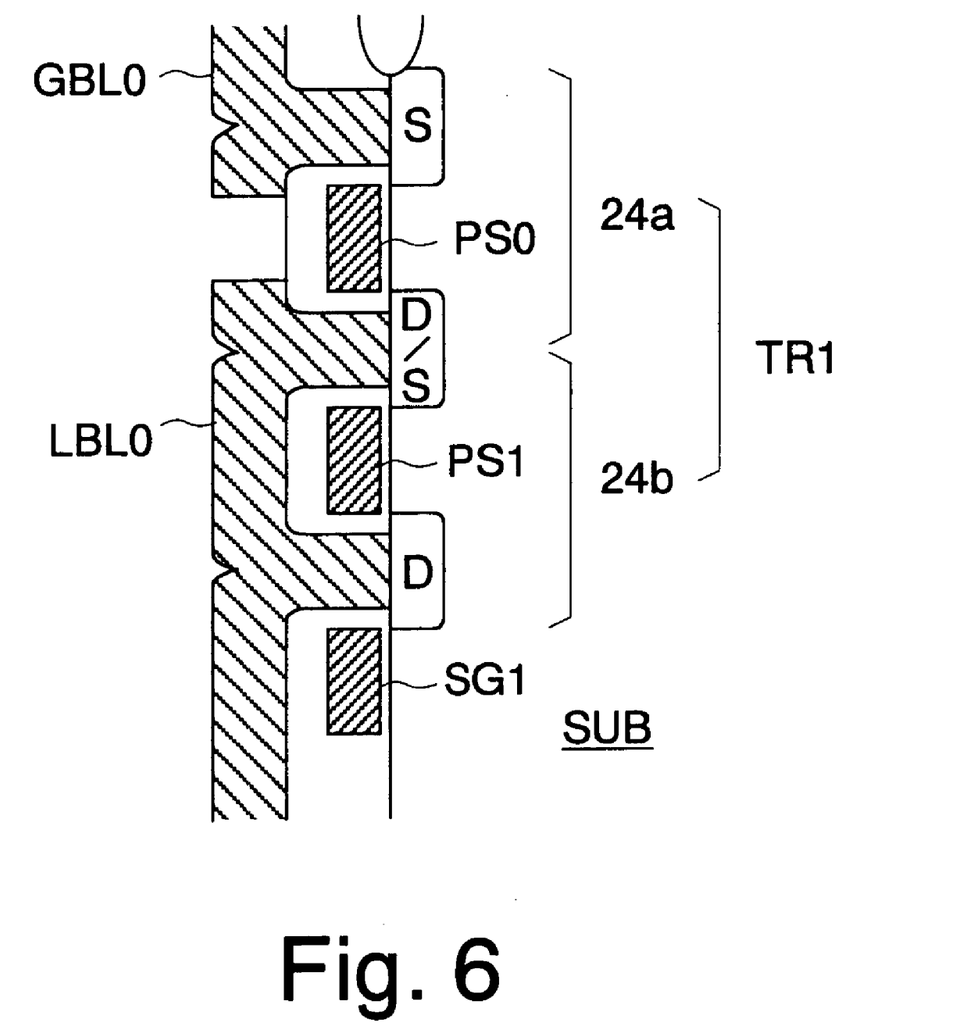
FIG. 6 is a sectional view showing a first transistor row of FIG. 5.

FIG. 6 shows a section of the first transistor row TR1 connected to the local bit line LBL0.

As described above, the first transistor row TR1 has the two transistors 24a and 24b. The source S of the transistor 24a is connected to the global bit line GBL0. The drain D of the transistor 24a is connected to the local bit line LBL0. Both the source S and the drain D of the transistor 24b are connected to the local bit line LBL0 through aluminum wiring. Accordingly, the transistor 24b, though formed as a device, is masked of transistor functions. Incidentally, the drain D of the transistor 24a and the source S of the transistor 24b are an identical diffusion layer since the transistors 24a and 24b are connected in series.

Now, referring to FIG. 4, an overview will be given of a read operation, a write operation, and an erase operation of the flash memory in the present embodiment.

To perform a read operation, a word line (WL1, for example) connected to a memory cell 20 to read data from is supplied with 0 V, and the other word lines (WL0 and WL2–WL15, for example) are supplied with 4 V. The source line ARVSS is supplied with 0 V. When the memory cell 20 is written with data and the threshold voltage of the memory cell 20 is high, no current flows through the local bit line (memory cell row MR). When the memory cell 20 is not written with data and the threshold voltage of the memory cell 20 is low, a current flows through the local bit line (memory cell row MR). Then, the sense amplifier in the input/output circuit 16 detects the current of the local bit line for data read.

To perform a write operation, a word line (WL1, for example) connected to a memory cell 20 to write data to is supplied with 20 V, and the other word lines (WL0 and WL2–WL15, for example) are supplied with 10 V. The source line ARVSS is supplied with 4 V. Then, electrons are tunnel-injected to the floating gate of the memory cell 20 to write data to, so that the threshold voltage of the memory cell 20 rises for data write.

To perform an erase operation, all the word lines WL0–WL15 are supplied with 0 V, and the source line ARVSS is brought into a floating state. Then, the well region of the memory core M is supplied with 20 V so that electrons trapped in the floating gates are emitted into the well region. Then, the threshold voltages of the memory cells 20 drop for data erase. The erase operation is performed on all the memory cells 20 in the memory core M.

Next, description will be given of the operation of the memory core M.

For example, to perform a read operation or a write operation on memory cell rows MR that are wired with the local bit line LBL0, the address decoder operates to turn the selecting lines PS0 and PS1 to a high level and a low level, respectively.

In the transistor row TR1 that is connected with the local bit line LBL0, the transistor 24a turns ON in response to the high level of the selecting line PS0. Since the transistor 24b is shorted between its source and drain, the turning-ON of the transistor 24a connects the local bit line LBL0 to the input/output circuit 16 through the global bit line GBL0.

In the transistor row TR1 that is connected with the local bit line LBL1, the transistor 24b turns OFF in response to the low level of the selecting line PS1. Therefore, the local bit line LBL1 is not connected to the input/output circuit 16.

In the transistor row TR2 that is connected with the local bit line LBL0, the transistor 26b turns OFF in response to the low level of the selecting line PS1. Therefore, the local bit line LBL0 is not connected to the voltage generator 18.

In the transistor row TR2 that is connected with the local bit line LBL1, the transistor 26a turns ON in response to the high level of the selecting line PS0. Since the transistor 26b is shorted between its source and drain, the turning-ON of the transistor 26a connects the local bit line LBL1 to the voltage generator 18 through the bit control line BLCOM. The voltage generator 18 supplies 0 V to the local bit line LBL1. The memory cell rows MR connected with the local bit line LBL1 are supplied with 0 V at both ends, thereby being inactivated. Then, the memory cell rows MR connected with the local bit line LBL0 perform a read operation or a write operation as described above.

When an erase operation is performed on all the memory cell rows MR within the memory core MR, both the selecting lines PS0 and PS1 are turned to the low level. All the local bit lines LBL0–LBL3 enter the floating state, and the erase operation is performed as described above.

Figure 7:
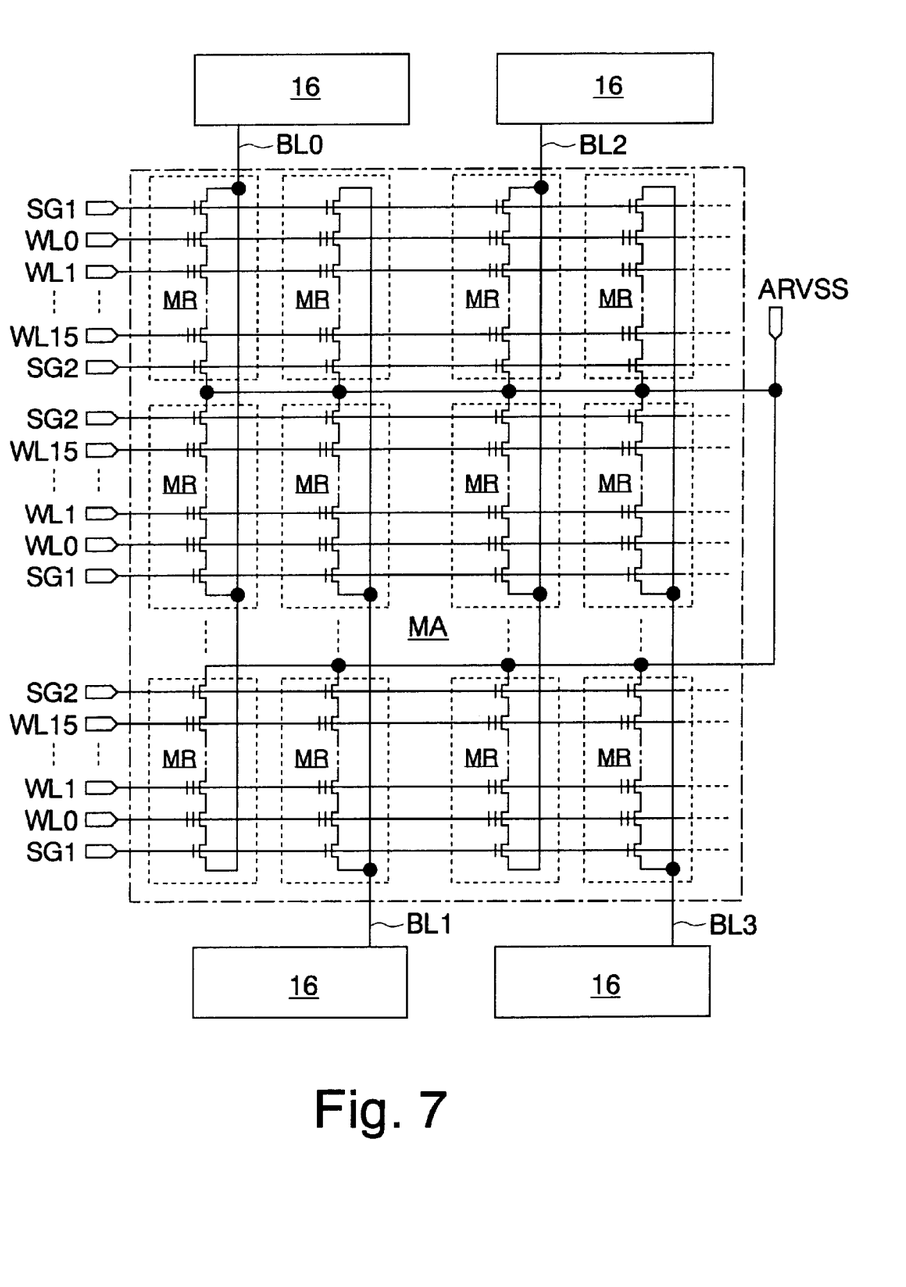
FIG. 7 is a circuit diagram showing a memory core that has been studied before the achievement of the present invention.

FIG. 7 shows the circuit of a memory core M, which has been studied by the present inventors before the achievement of the present invention.

In this example, bit lines BL0, BL1, BL2, and BL3 are provided with an input/output circuits 16 each. A plurality of memory cell rows MR is connected at one end to the bit lines BL0, BL1, BL2, and BL3, respectively. The other ends of the memory cell rows MR are connected to a common source line ARVSS.

As has been described, according to the present embodiment, the first transistor rows TR1 are provided with a plurality of transistors 24a and 24b in advance. In the wiring process using aluminum, either of the transistors is shorted between its source and drain so that one of the transistors 24a and 24b operates as a switch and the other transistor functions as wiring. Similarly, the second transistor rows TR2 are provided with a plurality of transistors 26a and 26b in advance. In the wiring process using aluminum, either of the transistors is shorted between its source and drain so that one of the transistors 26a and 26b operates as a switch and the other transistor functions as wiring. This eliminates the need for forming ion-implanted regions for making the source and the drain per transistor. Since the spacing with which the transistors 24a and 24b, or 26a and 26b, are arranged (the wiring spacing between the selecting lines PS0 and PS1) can be set without considering the layout rule of the diffusion layer regions, the transistors can be arranged closely. Consequently, the layout area of the first and second transistor rows TR1 and TR2 can be reduced, allowing a reduction in the chip size of the flash memory. In particular, the present invention offers a high effect when applied to nonvolatile semiconductor memories of NAND type which feature high integration.

A plurality of memory cell rows MR is arranged in series corresponding to the first transistor rows TR1. Sharing the first transistor rows TR1 among a plurality of memory cell rows MR allows the input/output circuit 18 to be shared among a greater number of memory cell rows MR, with a reduction in chip size.

The transistors 24a, 24b, 26a, and 26b not to be operated as switches are shorted between their source and drain by using aluminum wiring. On this account, even if a mistake is found in the positions of transistors to be operated as switches, this mistake can be corrected by simply changing the photomask in the wiring process.

The input/output circuits 16 and the voltage generator 18 are arranged on both sides of the memory cell rows MR. Therefore, these circuits 16 and 18 can be efficiently arranged in the peripheral regions of the memory cell rows without increasing the layout area.

Incidentally, the foregoing embodiment has dealt with the case where the present invention is applied to a flash memory. However, the present invention is not limited to such an embodiment. For example, the present invention may be applied to other nonvolatile semiconductor memories of NAND type.

The foregoing embodiment has dealt with the case where the two local bit lines LBL0 and LBL1 are connected to the single global bit line GBL0. However, the present invention is not limited to such an embodiment. For example, three or more local bit lines may be connected to a single global bit line. Here, the input/output circuits 16 and the voltage generator 18 can be shared easily by making the numbers of transistors to be formed in the first and second transistor rows TR1 and TR2 identical to the number of local bit lines connected to the global bit line.

The invention is not limited to the above embodiments and various modifications may be made without departing from the spirit and scope of the invention. Any improvement may be made in part or all of the components.

What is claimed is:

1. A semiconductor memory comprising:
   a plurality of memory cell rows each having memory cells connected in series;
   an input/output circuit for inputting/outputting data to/from said memory cell rows; and
   a plurality of first transistor rows corresponding to each of said memory cell rows for selectively connecting any of said memory cell rows to said input/output circuit, said first transistor rows each including a switching transistor operating as a switch and a short transistor(s) each having a source and a drain shorted to each other, which are connected in series.

2. The semiconductor memory according to claim 1, comprising:
   local bit lines for connecting said memory cell rows to said first transistor rows, respectively; and
   a global bit line for connecting said first transistor rows to said input/output circuit.

3. The semiconductor memory according to claim 1, comprising:
   a plurality of said memory cell rows corresponding to each of said first transistor rows; and
   selecting transistors in each of said memory cell rows for selectively connecting any of said memory cell rows to a corresponding transistor row of said first transistor rows.

4. The semiconductor memory according to claim 1, wherein
   said source and said drain of said short transistor in each of said first transistor rows are shorted by metal wiring.

5. The semiconductor memory according to claim 1, comprising:
   a voltage generator for supplying a predetermined voltage to the unselected memory cell row(s) among said memory cell rows; and
   a plurality of second transistor rows corresponding to each of said memory cell rows for selectively connecting said unselected memory cell row(s) to said voltage generator, said second transistor rows each including a switching transistor operating as a switch and a short transistor(s) each having a source and a drain shorted to each other, which are connected in series.

6. The semiconductor memory according to claim 5, comprising:
   local bit lines for connecting said memory cell rows to said first and second transistor rows, respectively; and
   a common bit control line for connecting said second transistor rows to said voltage generator.

7. The semiconductor memory according to claim 6, wherein
   said voltage generator supplies a first voltage and a second voltage to said local bit line(s) of said unselected memory cell row(s), respectively, when the selected memory cell row among said memory cell rows performs a read operation and a write operation.

8. The semiconductor memory according to claim 5, wherein
   said input/output circuit and said voltage generator are arranged on both sides of said memory cell rows.

9. The semiconductor memory according to claim 1, wherein
   said source and said drain of said short transistor in each of said second transistor rows are shorted by metal wiring.

10. The semiconductor memory according to claim 1, wherein:
    said memory cells are nonvolatile memory cells each having a control gate and a floating gate; and
    said memory cell rows are of NAND type.

* * * * *